US010242871B2

(12) United States Patent
Nishita et al.

(10) Patent No.: US 10,242,871 B2
(45) Date of Patent: Mar. 26, 2019

(54) RESIST UNDERLAYER FILM-FORMING COMPOSITION INCLUDING A COMPOUND HAVING AN AMINO GROUP PROTECTED WITH A TERT-BUTOXYCARBONYL GROUP

(71) Applicant: NISSAN CHEMICAL INDUSTRIES, LTD., Tokyo (JP)

(72) Inventors: Tokio Nishita, Toyama (JP); Noriaki Fujitani, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 85 days.

(21) Appl. No.: 15/519,696

(22) PCT Filed: Oct. 16, 2015

(86) PCT No.: PCT/JP2015/079323
§ 371 (c)(1),
(2) Date: Apr. 17, 2017

(87) PCT Pub. No.: WO2016/063805
PCT Pub. Date: Apr. 28, 2016

(65) Prior Publication Data
US 2017/0250079 A1    Aug. 31, 2017

(30) Foreign Application Priority Data
Oct. 21, 2014    (JP) .................. 2014-214581

(51) Int. Cl.
*H01L 29/08* (2006.01)
*H01L 21/033* (2006.01)
(Continued)

(52) U.S. Cl.
CPC .......... *H01L 21/0332* (2013.01); *C08F 20/34* (2013.01); *C08F 20/58* (2013.01);
(Continued)

(58) Field of Classification Search
CPC .................................................. H01L 21/0332
(Continued)

(56) References Cited

U.S. PATENT DOCUMENTS 6,344,590 B1 *   2/2002   Nakano ................. C07C 31/137
                                                     556/449
7,183,423 B1 *   2/2007   Ishii ..................... B01J 31/0247
                                                     549/313
(Continued)

FOREIGN PATENT DOCUMENTS

JP      2005-122104 A      5/2005
JP      2012-036385 A      2/2012
(Continued)

OTHER PUBLICATIONS

Jan. 19, 2016 International Search Report issued in International Patent Application No. PCT/JP215/079323.
(Continued)

*Primary Examiner* — Caleb E Henry
(74) *Attorney, Agent, or Firm* — Oliff PLC

(57) ABSTRACT

There is provided a composition that a resist pattern having a reduced LWR representing variations in line width of the resist pattern, compared to conventional resist patterns, can be formed. A resist underlayer film-forming composition for lithography comprising a polymer, 0.1 to 30 parts by mass of a compound having an amino group protected with a tert-butoxycarbonyl group and an unprotected carboxyl group, or a hydrate of the compound, relative to 100 parts by mass of the polymer, and a solvent.

8 Claims, 1 Drawing Sheet

X=13 μm, Y=14 μm, Z=230nm

(51) Int. Cl.
- *C08G 59/22* (2006.01)
- *C08F 20/34* (2006.01)
- *C08F 20/58* (2006.01)
- *C09D 133/14* (2006.01)
- *G03F 7/004* (2006.01)
- *G03F 7/20* (2006.01)
- *H01L 21/027* (2006.01)
- *G03F 7/09* (2006.01)

(52) U.S. Cl.
CPC ........... *C08G 59/22* (2013.01); *C09D 133/14* (2013.01); *G03F 7/004* (2013.01); *G03F 7/094* (2013.01); *G03F 7/2002* (2013.01); *H01L 21/0271* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 2002/0025495 | A1* | 2/2002 | Ogata | G03F 7/0757 430/287.1 |
| 2002/0058202 | A1* | 5/2002 | Maemori | G03F 7/0048 430/270.1 |
| 2006/0058480 | A1* | 3/2006 | Koyama | C07D 493/04 526/242 |
| 2006/0160247 | A1* | 7/2006 | Koyama | C07C 67/04 438/1 |
| 2006/0257785 | A1* | 11/2006 | Johnson | G03F 7/038 430/270.1 |
| 2008/0311527 | A1* | 12/2008 | Kim | G03F 7/2022 430/313 |
| 2009/0311624 | A1* | 12/2009 | Horiguchi | G03F 7/091 430/271.1 |
| 2011/0008968 | A1* | 1/2011 | Chang | H01L 21/76807 438/703 |
| 2011/0098433 | A1* | 4/2011 | Lee | C08F 220/38 526/243 |
| 2011/0244394 | A1* | 10/2011 | Eguchi | C08F 220/18 430/270.1 |
| 2012/0021029 | A1* | 1/2012 | Garcia Sanz | A61K 47/48038 424/401 |
| 2013/0130183 | A1* | 5/2013 | Kobayashi | G03F 7/004 430/325 |
| 2014/0120141 | A1* | 5/2014 | Garcia Anton | C07K 7/06 424/401 |
| 2014/0322307 | A1* | 10/2014 | Ferrer Montiel | A61K 38/08 424/450 |
| 2015/0071974 | A1* | 3/2015 | Ferrer Montiel | A61K 8/64 424/401 |
| 2015/0098989 | A1* | 4/2015 | Ferrer Montiel | A61K 8/64 424/450 |
| 2015/0104485 | A1* | 4/2015 | Garcia Anton | C07K 5/1005 424/401 |
| 2015/0140046 | A1* | 5/2015 | Ferrer Montiel | A61K 8/64 424/401 |
| 2015/0342852 | A1* | 12/2015 | Van Den Nest | C07K 7/06 424/474 |
| 2016/0075738 | A1* | 3/2016 | Ferrer Montiel | A61K 8/64 424/450 |

FOREIGN PATENT DOCUMENTS

| | | |
|---|---|---|
| JP | 2014-074896 A | 4/2014 |
| WO | 2009/008446 A1 | 1/2009 |
| WO | 2010/061774 A1 | 6/2010 |
| WO | 2012/090408 A1 | 7/2012 |
| WO | 2013/058189 A1 | 4/2013 |
| WO | 2013/168610 A1 | 11/2013 |

OTHER PUBLICATIONS

Jan. 19, 2016 Written Opinion issued in International Patent Application No. PCT/JP215/079323.

Sep. 27, 2018 Office Action issued in Japanese Patent Application No. 2016-555201.

* cited by examiner

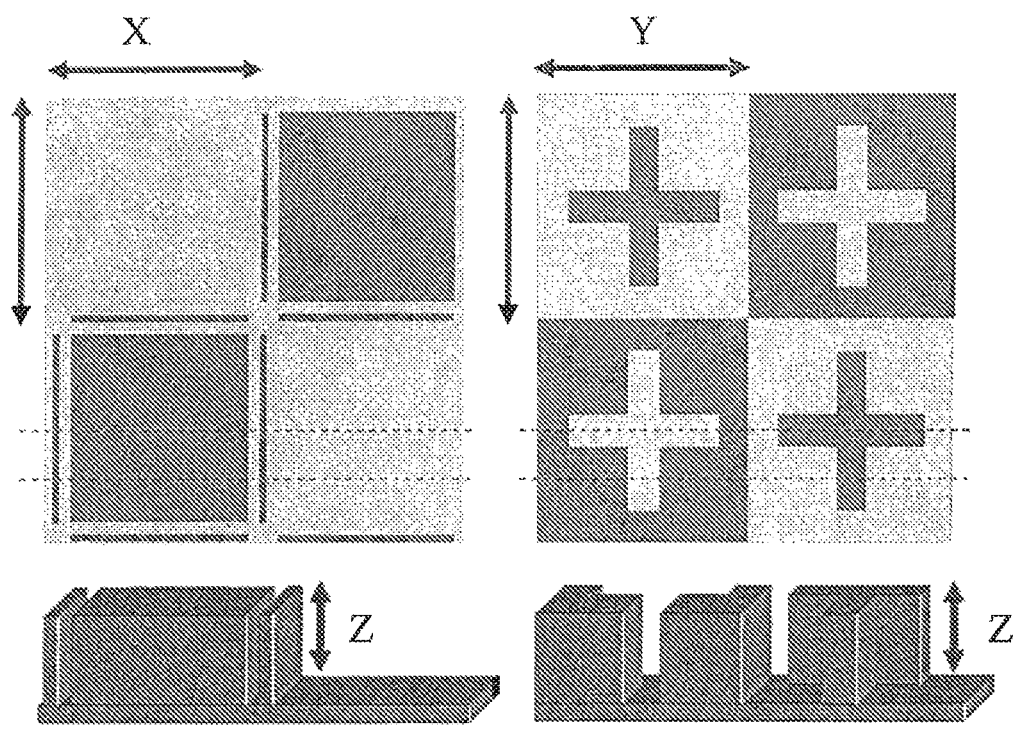
X=13 μm, Y=14 μm, Z=230nm

RESIST UNDERLAYER FILM-FORMING COMPOSITION INCLUDING A COMPOUND HAVING AN AMINO GROUP PROTECTED WITH A TERT-BUTOXYCARBONYL GROUP

TECHNICAL FIELD

The present invention relates to a resist underlayer film-forming composition for lithography comprising a compound having an amino group protected with a tert-butoxycarbonyl group (hereinafter abbreviated as a Boc group in the present description) and an unprotected carboxyl group, in a predetermined proportion relative to a polymer. The present invention also relates to a resist underlayer film-forming composition for lithography that has excellent coating properties on a substrate even in the case of forming a resist underlayer film with a small film thickness (for example, 20 nm or less), and improves the size of variations in the line width of the line pattern of the resist formed.

BACKGROUND ART

Patent Document 1 discloses a resist underlayer film (anti-reflective coating) that is free of intermixing with a resist film formed as an upper layer, achieves desired optical parameters (k value and n value) in the case of exposure using an ArF excimer laser, and achieves a selection ratio of dry etching rate higher than that of the resist film.

On the other hand, lithography that adopts EUV (an abbreviation of Extreme Ultraviolet, wavelength: 13.5 nm) exposure, which is an advanced fine processing technology, has the problem of roughness on the side walls of the resist pattern due to its finer pattern, even though there is no reflection from the substrate. Thus, many studies have been conducted concerning resist underlayer films for forming highly rectangular resist pattern shapes. A resist underlayer film-forming composition in which outgassing has been reduced is disclosed (Patent Document 2) as a material for forming a resist underlayer film for exposure to high energy beams such as EUV, X-rays, and electron beams.

PRIOR ART DOCUMENTS

Patent Documents

Patent Document 1: WO 2009/008446
Patent Document 2: WO 2010/061774

SUMMARY OF THE INVENTION

Problem to be Solved by the Invention

Examples of properties required in a resist underlayer film include being free of intermixing with the resist film formed as an upper layer (being insoluble in a resist solvent), and having a dry etching rate higher than that of the resist film.

In the case of lithography that involves EUV exposure, the pattern formed has a line width of 32 nm or less, and thus, a resist underlayer film for EUV exposure is formed with a film thickness smaller than those of conventional resist underlayer films. Reducing the film thickness of the resist underlayer film, however, has the problem of worsening the LWR (Line Width Roughness), which represents variations in line width, of the resist pattern formed thereon.

An object of the present invention is to provide a composition for forming a resist underlayer film that can form a desired resist pattern, by solving the above-described problem.

Means for Solving the Problem

The present invention is a resist underlayer film-forming composition for lithography comprising a polymer, 0.1 to 30 parts by mass of a compound having an amino group protected with a Boc group and an unprotected carboxyl group, or a hydrate of the compound, relative to 100 parts by mass of the polymer, and a solvent.

The above-described compound is represented by, for example, Formula (1a) or (1b):

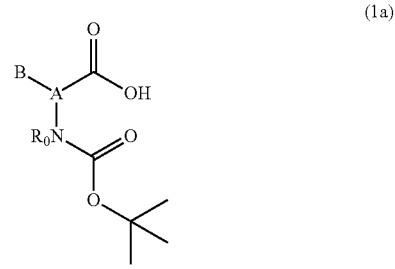

(1a)

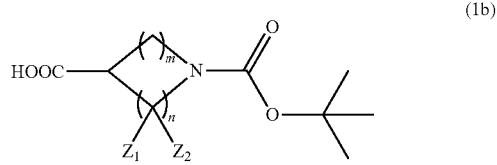

(1b)

(wherein A is a $C_{1-6}$ linear hydrocarbon group, alicyclic hydrocarbon group, aromatic hydrocarbon group, or aromatic heterocyclic group, and the linear hydrocarbon group optionally has at least one hetero atom, for example, a nitrogen, sulfur, or oxygen atom; B is a hydrogen atom or a $C_{1-21}$ organic group, and the organic group optionally has at least one linking group selected from the group consisting of a carbonyl group, an —OC(=O)— group, an —O— group, a —S— group, a sulfonyl group, and a —NH— group, and/or optionally has at least one substituent selected from the group consisting of a hydroxy group, a thiol group, a halogeno group (the halogeno group is a fluoro group, a chloro group, a bromo group, or an iodo group, for example), an amino group, and a nitro group; $R_0$ is a hydrogen atom or a methyl group; $Z_1$ and $Z_2$ are each independently a hydrogen atom, a hydroxy group, a halogeno group, an amino group, or a nitro group; m is an integer from 0 to 2; and n is an integer from 1 to 4.)

When B is a $C_{1-21}$ organic group in Formula (1a), examples of such organic groups include the following:

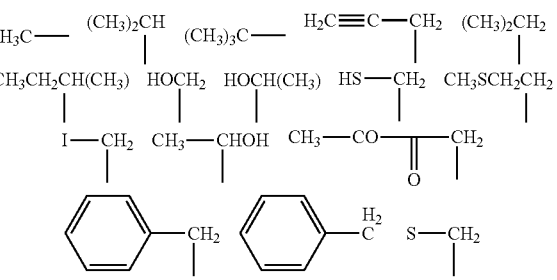

-continued

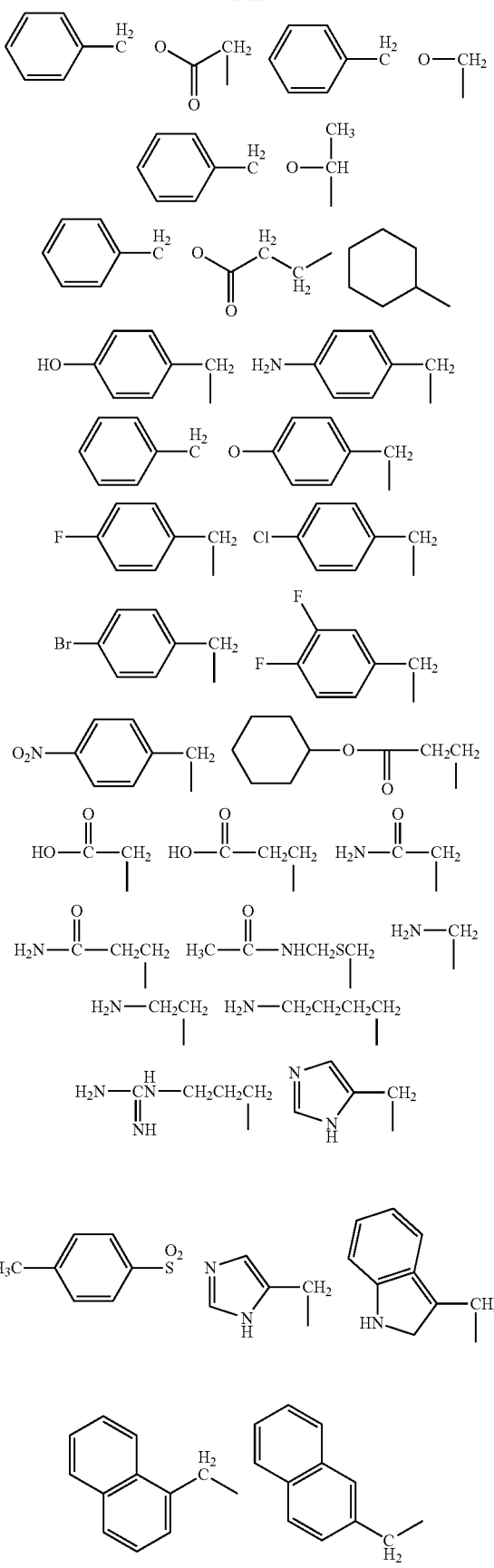

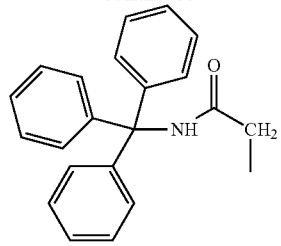

Effects of the Invention

The resist underlayer film-forming composition for lithography of the present invention contains the compound of Formula (1a) or (1b), for example, having an amino group protected with a Boc group and an unprotected carboxyl group, in a predetermined proportion relative to the polymer. Thus, when a thin resist underlayer film is formed using this composition, a resist pattern having a reduced LWR representing variations in line width, compared to conventional resist patterns, can be formed thereon.

BRIEF DESCRIPTION OF THE DRAWINGS

FIG. 1 illustrates plan views showing upper surfaces of substrates each having a pattern formed thereon, as well as perspective views showing cross-sectional structures thereof, used in the coating property test.

MODES FOR CARRYING OUT THE INVENTION

[Polymer]

The polymer contained in the resist underlayer film-forming composition for lithography of the present invention has a structural unit of Formula (2) and a structural unit of Formula (3), for example:

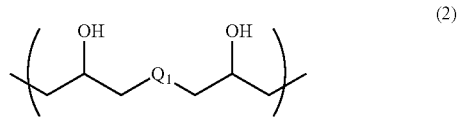

(2)

(3)

(wherein $Q_1$ and $Q_2$ are each independently a divalent organic group having a $C_{1-13}$ hydrocarbon group optionally having a substituent, a divalent organic group having an aromatic ring, or a divalent organic group having a heterocyclic ring containing 1 to 3 nitrogen atoms.)

Examples of the above-described $C_{1-13}$ hydrocarbon group include $C_{1-13}$ linear or branched alkyl groups, such as tert-butyl group, methyl group, ethyl group, propyl group, isopropyl group, butyl group, sec-butyl group, pentyl group, hexyl group, octyl group, nonyl group, decyl group, undecyl group, and dodecyl group.

When the above-described hydrocarbon group has a substituent, examples of the substituent include halogeno groups. The above-described hydrocarbon group is a linear or branched hydrocarbon group, an alicyclic hydrocarbon group, or a combination of a linear or branched hydrocarbon group and an alicyclic hydrocarbon group. Examples of such alicyclic hydrocarbon groups include a cyclobutylene group, a cyclopentylene group, and a cyclohexylene group.

Examples of the above-described heterocyclic ring containing 1 to 3 nitrogen atoms include triazinetrione, pyrimidinetrione, imidazolidinedione, imidazolidone, and pyridone.

The structural unit of Formula (2) is represented by Formula (2'), for example:

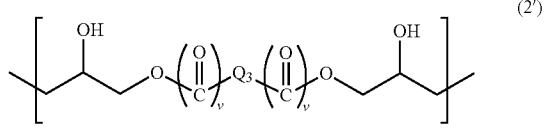

(wherein $Q_3$ is a $C_{1-13}$ hydrocarbon group optionally having a substituent, or an aromatic ring optionally having a substituent, and two v's are each independently 0 or 1.)

When the above-described hydrocarbon group has a substituent, examples of the substituent include halogeno groups. The above-described hydrocarbon group is a linear or branched hydrocarbon group, an alicyclic hydrocarbon group, or a combination of a linear or branched hydrocarbon group and an alicyclic hydrocarbon group. When the above-described aromatic ring has a substituent, examples of the substituent include $C_{1-6}$ alkyl groups.

$Q_3$ is a group of any of the following formulas, for example:

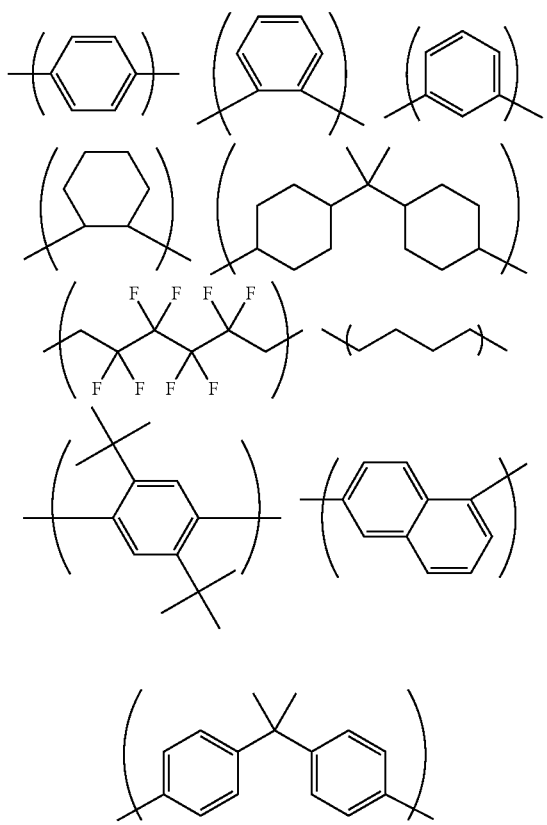

The structural unit of Formula (3) is represented by Formula (3'), for example:

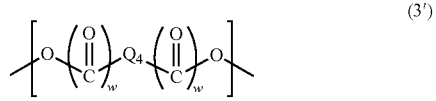

(wherein $Q_4$ is a $C_{1-13}$ hydrocarbon group optionally having a substituent, or an aromatic ring optionally having a substituent, and two w's are each independently 0 or 1.)

When the above-described hydrocarbon group has a substituent, examples of the substituent include a hydroxy group and halogeno groups. The above-described hydrocarbon group is a linear or branched hydrocarbon group, an alicyclic hydrocarbon group, or a combination of a linear or branched hydrocarbon group and an alicyclic hydrocarbon group. The above-described linear or branched hydrocarbon group may have a double bond between two carbon atoms. When the above-described aromatic ring has a substituent, examples of the substituent include $C_{1-6}$ alkyl groups and a hydroxy group. $Q_4$ is a group of any of the following formulas, for example:

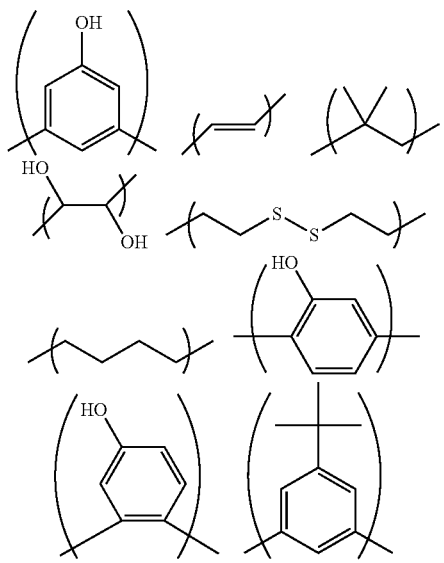

The above-described polymer has a structure of Formula (4), for example, at an end of the polymer chain:

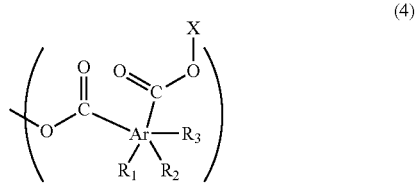

(wherein $R_1$, $R_2$, and $R_3$ are each independently a hydrogen atom, a $C_{1-13}$ linear or branched alkyl group, a halogeno group (the halogeno group is a fluoro group, a chloro group, a bromo group, or an iodo group, for example), or a hydroxy group, and at least one of $R_1$, $R_2$, and $R_3$ is the above-described alkyl group; Ar is a benzene ring, a naphthalene ring, or an anthracene ring, and each of the two carbonyl groups is attached to one of the adjacent two carbon atoms of the ring represented by Ar, and X is a $C_{1-6}$ linear or branched alkyl group optionally having a $C_{1-3}$ alkoxy group as a substituent.)

The polymer contained in the resist underlayer film-forming composition for lithography of the present invention may be any of a random copolymer, a block copolymer, an alternating copolymer, and a graft copolymer. Various processes such as solution polymerization, suspension polymerization, emulsion polymerization, and block polymerization can be used as the polymerization process for the polymer, and a polymerization catalyst, for example, may be used, as appropriate.

The weight average molecular weight of the above-described polymer is 1000 to 100000, for example, and preferably 1000 to 10000. If the value of this weight average molecular weight is excessively high, the coating properties of the resist underlayer film-forming composition for lithography of the present invention will become poor. The proportion of the above-described polymer contained in the resist underlayer film-forming composition for lithography of the present invention is 0.01 to 3 parts by mass, for example, and preferably 0.1 to 2 parts by mass, relative to 100 parts by mass of the composition.

[Boc Amino Acid]

The resist underlayer film-forming composition for lithography of the present invention contains, in addition to the above-described polymer, a compound having an amino group protected with a Boc group and an unprotected carboxyl group, or a hydrate of the compound. The above-described compound or a hydrate thereof will be hereinafter abbreviated as a Boc amino acid in the present specification. Examples of Boc amino acids contained in the resist underlayer film-forming composition for lithography of the present invention include compounds of Formulas (a-1) to (a-91):

(a-1)

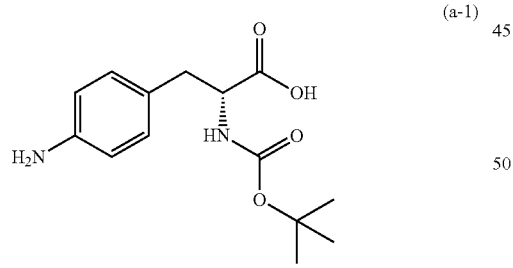

(a-2)

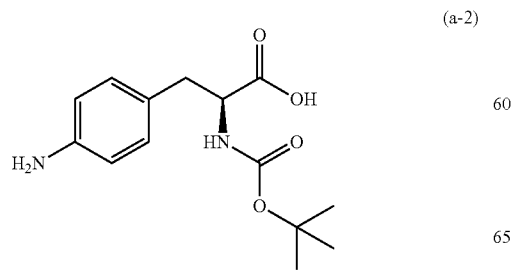

(a-3)

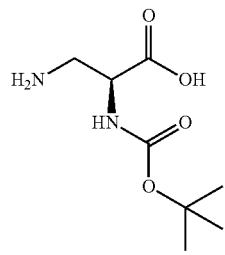

(a-4)

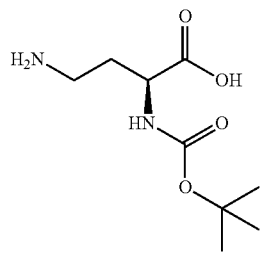

(a-5)

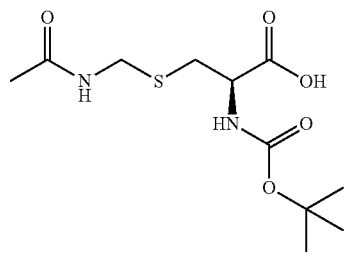

(a-6)

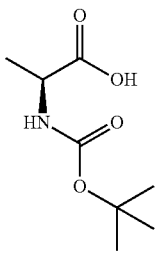

(a-7)

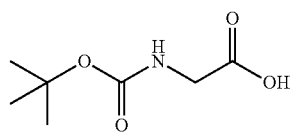

(a-8)

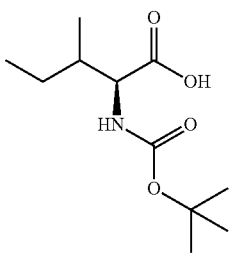

(a-9)
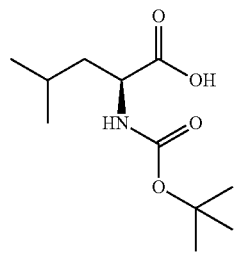
(a-10)
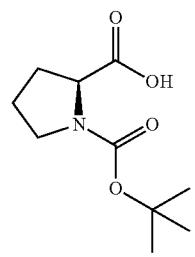
(a-11)
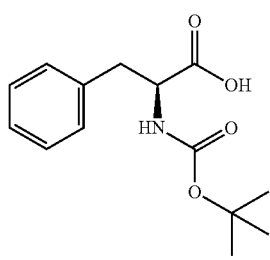
(a-12)
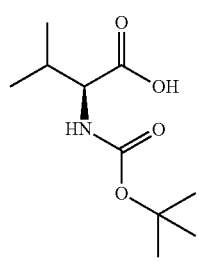
(a-13)
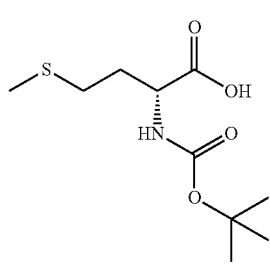
(a-14)
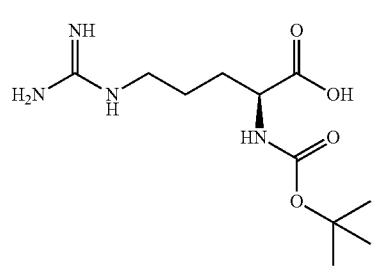
(a-15)
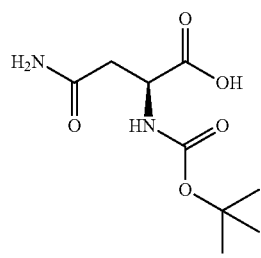
(a-16)
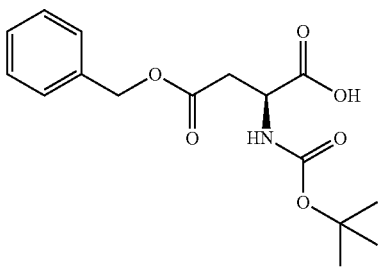
(a-17)
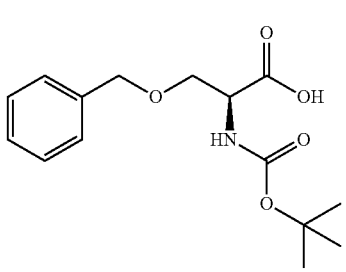
(a-18)
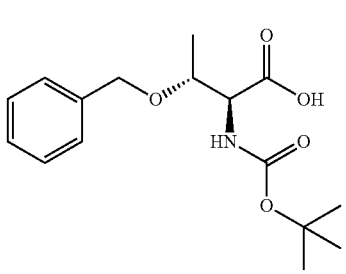
(a-19)
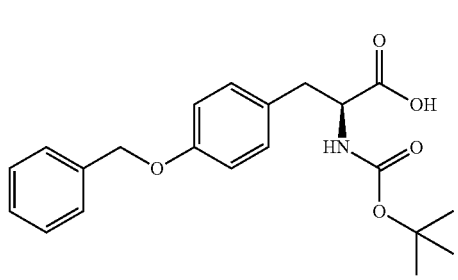
(a-20)
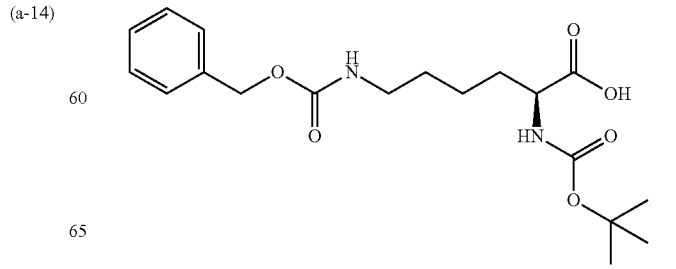

(a-21)
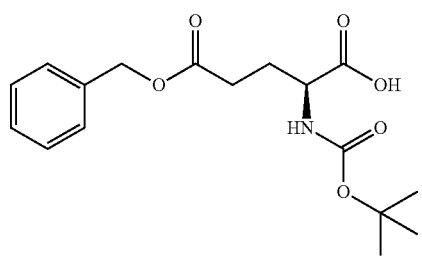
(a-22)
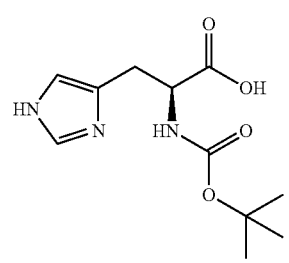
(a-23)
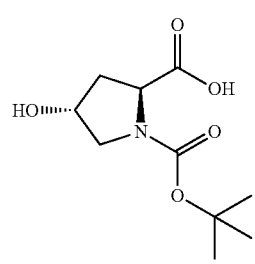
(a-24)
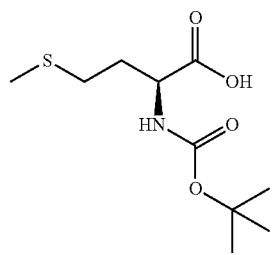
(a-25)
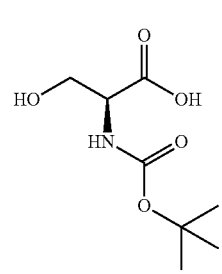
(a-26)
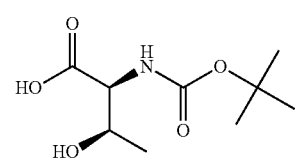
(a-27)
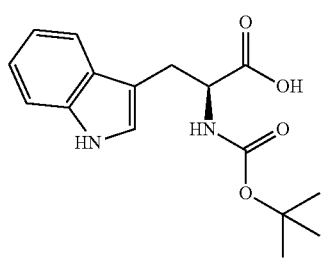
(a-28)
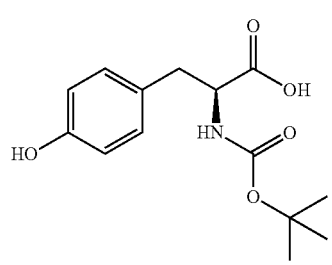
(a-29)
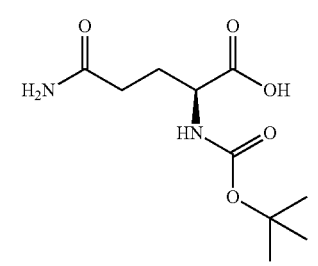
(a-30)
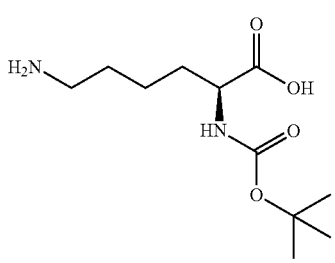
(a-31)
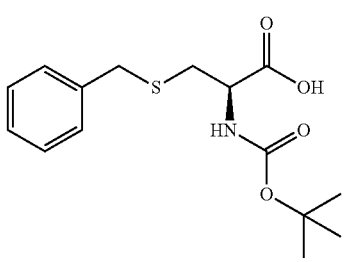
(a-32)
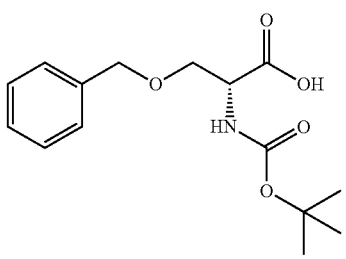

(a-33)
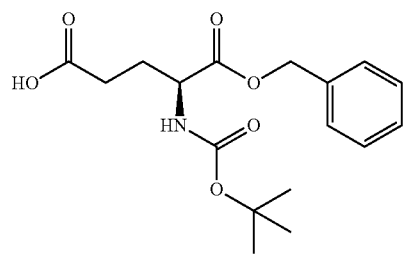
(a-34)
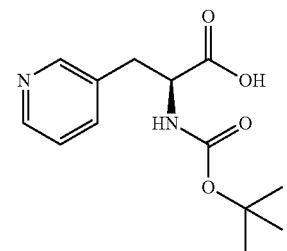
(a-35)
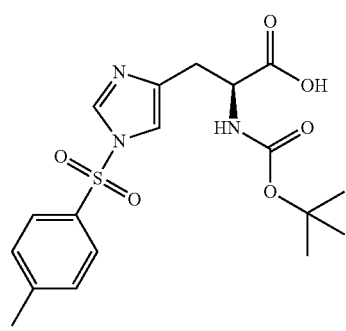
(a-36)
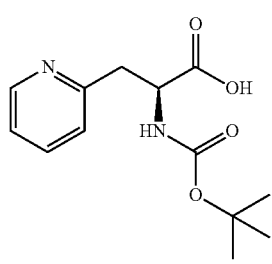
(a-37)
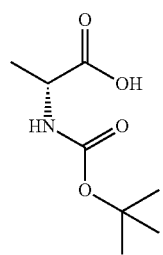
(a-38)
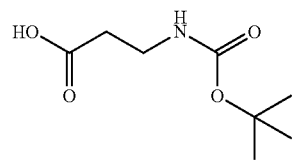
(a-39)
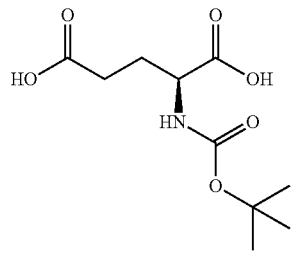
(a-40)
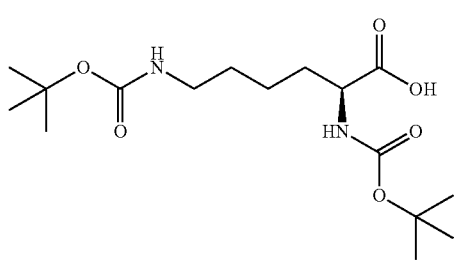
(a-41)
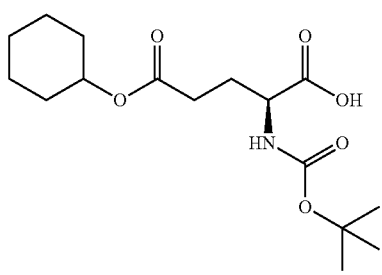
(a-42)
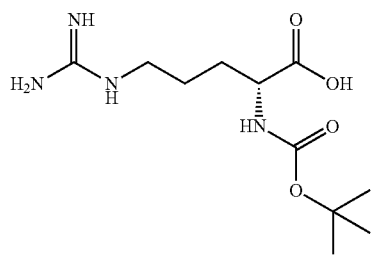
(a-43)
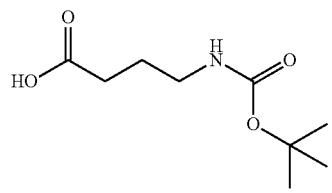
(a-44)
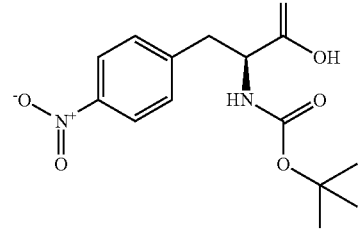

(a-45)
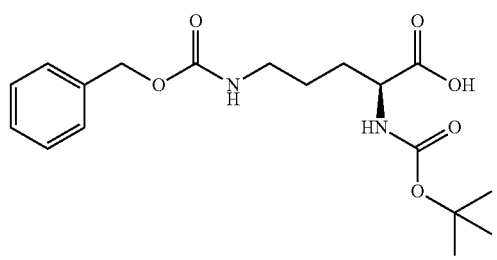
(a-46)
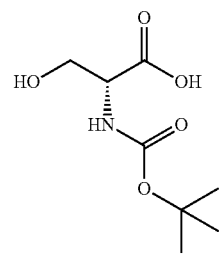
(a-47)
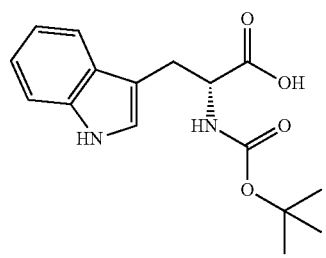
(a-48)
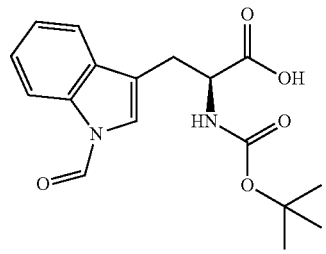
(a-49)
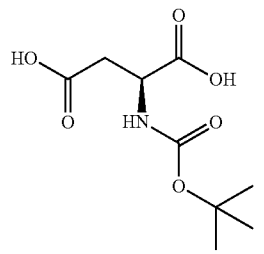
(a-50)
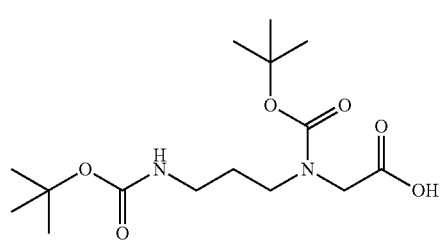
(a-51)
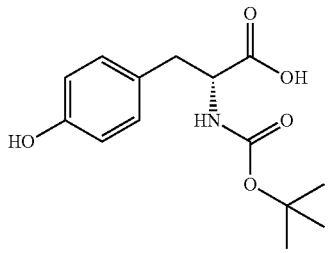
(a-52)
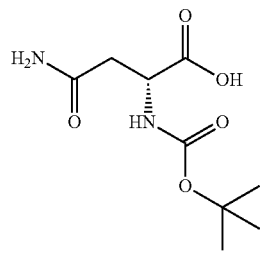
(a-53)
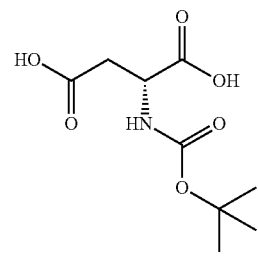
(a-54)
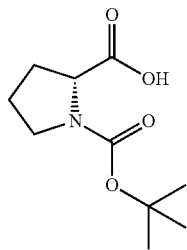
(a-55)
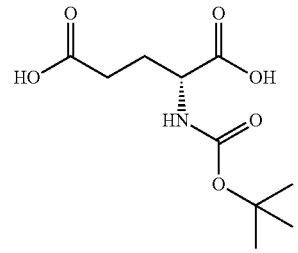
(a-56)
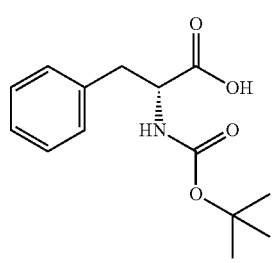

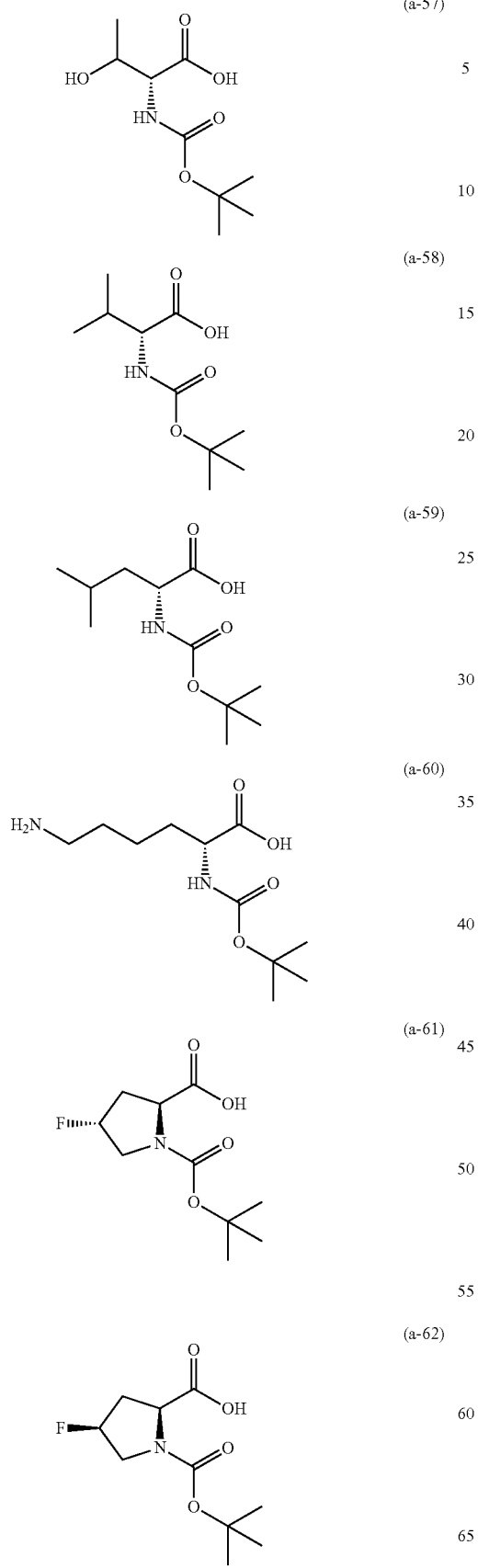
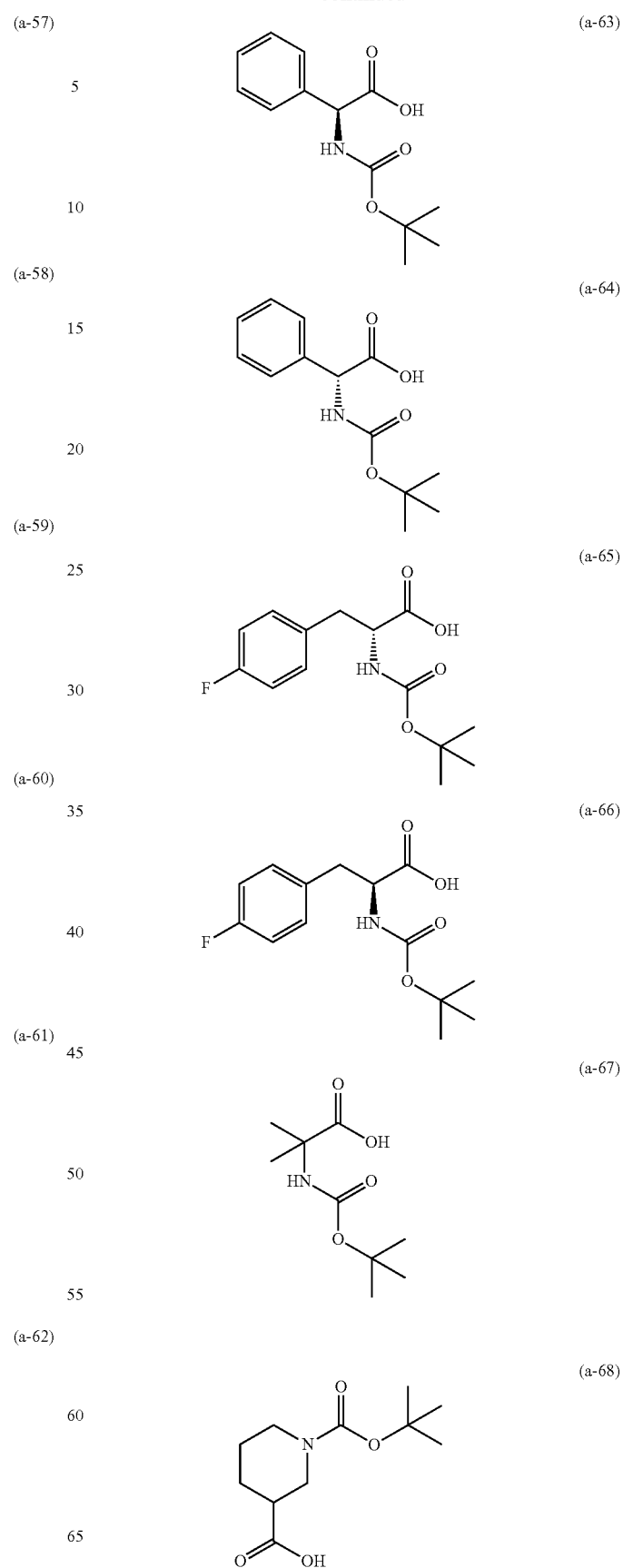

(a-69) 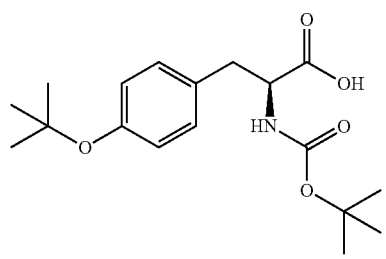
(a-70) 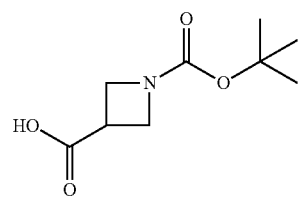
(a-71) 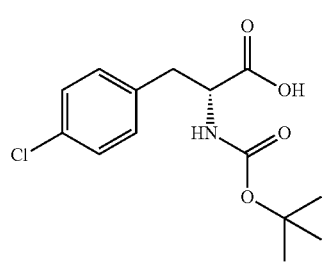
(a-72) 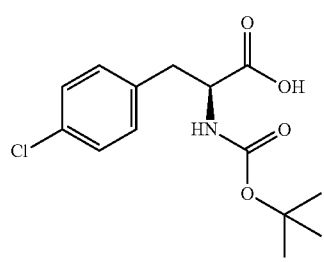
(a-73) 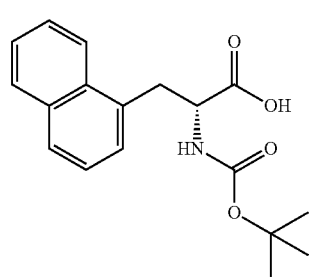
(a-74) 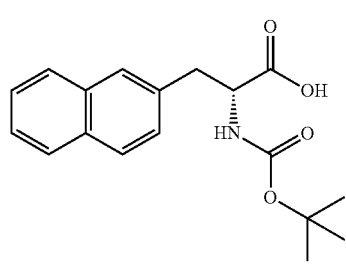
(a-75) 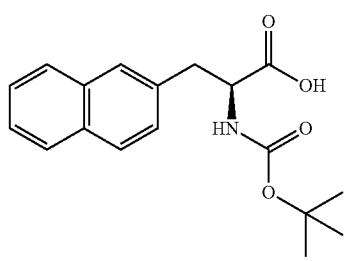
(a-76) 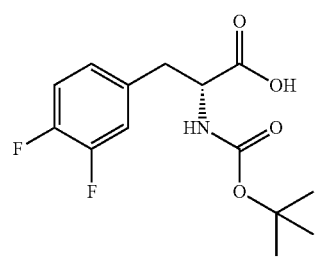
(a-77) 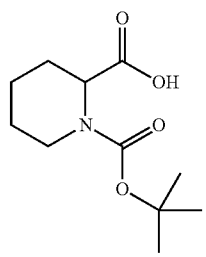
(a-78) 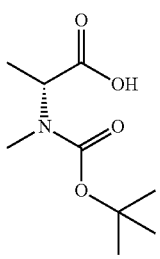
(a-79) 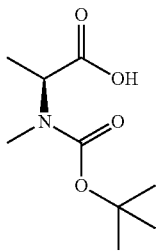
(a-80) 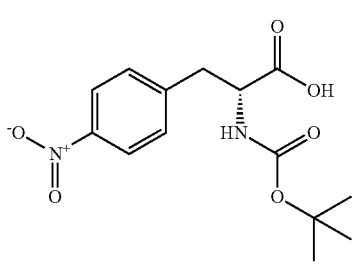

(a-81) 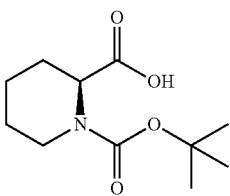

(a-82) 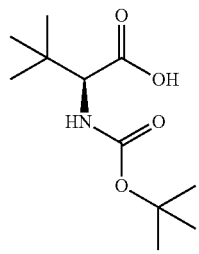

(a-83) 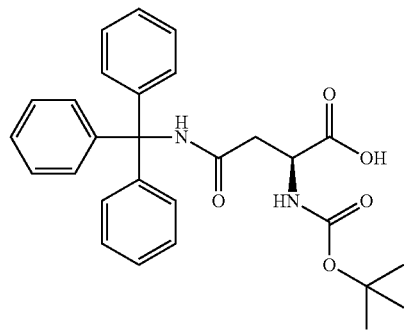

(a-84) 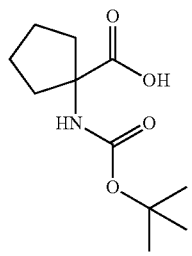

(a-85) 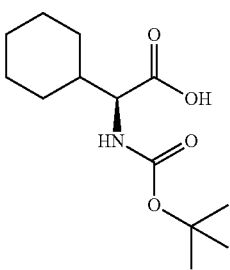

(a-86) 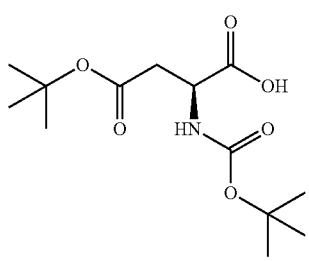

(a-87) 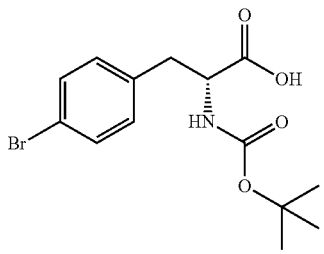

(a-88) 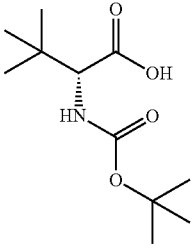

(a-89) 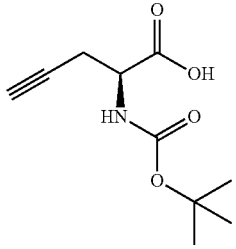

(a-90) 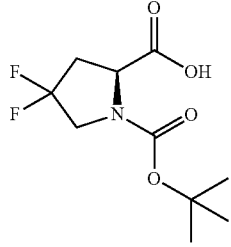

(a-91) 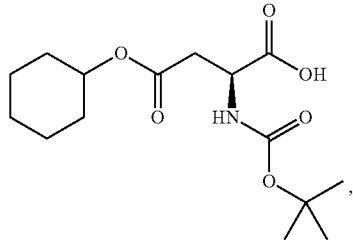

These compounds are used alone or in combination of two or more. Of these compounds, the compound of Formula (a-6), the compound of Formula (a-7), the compound of Formula (a-9) and a hydrate thereof, as well as the compound of Formula (a-84) are preferred. That is, N-(tert-butoxycarbonyl)-L-alanine, N-(tert-butoxycarbonyl)glycine, N-(tert-butoxycarbonyl)-L-leucine and a hydrate thereof, as well as 1-(tert-butoxycarbonylamino)cyclopentanecarboxylic acid are preferred.

The proportion of the above-described Boc amino acid contained in the resist underlayer film-forming composition for lithography of the present invention is 0.1 to 30 parts by mass, and preferably 0.1 to 20 parts by mass, relative to 100 parts by mass of the above-described polymer contained in the composition. If the proportion of the above-described Boc amino acid is less than 0.1 part by mass, the effect attributed to the addition of the Boc amino acid cannot be obtained, whereas if the proportion is greater than 30 parts by mass, the resist underlayer film formed cannot achieve solvent resistance.

[Solvent]

The resist underlayer film-forming composition for lithography of the present invention further contains a solvent. The solvent is not particularly limited as long as it can dissolve the above-mentioned polymer, and examples of those usable as the solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monopropyl ether, 1-ethoxy-2-propanol, propylene glycol monomethyl ether acetate, propylene glycol propyl ether acetate, 1-methoxy-2-butanol, 2-methoxy-1-butanol, 3-methoxy-3-methylbutanol, 3-methoxy-1-butanol, toluene, xylene, methyl ethyl ketone, cyclopentanone, cyclohexanone, γ-butyrolactone, N-methyl-2-pyrrolidone, methyl 2-hydroxyisobutyrate, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These solvents are used alone or in combination of two or more.

Of the above-described solvents, propylene glycol monomethyl ether, propylene glycol monomethyl ether acetate, 1-ethoxy-2-propanol, ethyl lactate, butyl lactate, and cyclohexanone are preferred. The proportion of the above-described solvent contained in the resist underlayer film-forming composition for lithography of the present invention is 90 to 99.99 parts by mass, or 98 to 99.9 parts by mass, relative to 100 parts by mass of the composition.

[Crosslinking Agent]

The resist underlayer film-forming composition for lithography of the present invention may further contain a crosslinking agent. While the crosslinking agent is not particularly limited, a nitrogen-containing compound having at least two crosslinkable substituents (for example, a methylol group, a methoxymethyl group, and a butoxymethyl group) is preferably used as the crosslinking agent.

Examples of the above-described crosslinking agent include hexamethoxymethylmelamine, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea.

The proportion of the above-described crosslinking agent contained in the resist underlayer film-forming composition for lithography of the present invention is 1 to 100 parts by mass, and preferably 10 to 50 parts by mass, relative to 100 parts by mass of the above-described polymer contained in the composition.

[Crosslinking Catalyst]

To promote the crosslinking reaction, the resist underlayer film-forming composition for lithography of the present invention may further contain a crosslinking catalyst. Examples of those usable as the crosslinking catalyst include sulfonic acid compounds and carboxylic acid compounds such as p-toluenesulfonic acid, trifluoromethanesulfonic acid, pyridinium p-toluenesulfonate, salicylic acid, camphor sulfonic acid, 5-sulfosalicylic acid, 4-chlorobenzenesulfonic acid, 4-hydroxybenzenesulfonic acid, benzenedisulfonic acid, l-naphthalenesulfonic acid, citric acid, benzoic acid, and hydroxybenzoic acid. These crosslinking catalysts are used alone or in combination of two or more.

The proportion of the above-described crosslinking catalyst contained in the resist underlayer film-forming composition for lithography of the present invention is 0.1 to 25 parts by mass, for example, and preferably 1 to 10 parts by mass, relative to 100 parts by mass of the above-described crosslinking agent contained in the composition.

[Other Additives]

The resist underlayer film-forming composition for lithography of the present invention may further contain additives such as a surfactant, as required, as long as the effects of the present invention are not lost. The surfactant is an additive for improving the coating properties of the above-described composition on the substrate. Specific examples of such surfactants include polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; nonionic surfactants such as polyoxyethylene sorbitan fatty acid esters, for example, polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants such as EFTOP [registered trademark] EF301, EF303, and EF352 [from Mitsubishi Materials Electronic Chemicals Co., Ltd.], MEGAFACE [registered trademark] F171, F173, R-30, R-40, and R-40-LM (from DIC Corporation), Fluorad FC430 and FC431 (from Sumitomo 3M Co., Ltd.), AsahiGuard [registered trademark] AG710, Surflon [registered trademark] S-382, SC101, SC102, SC103, SC104, SC105, and SC106 (from Asahi Glass Co., Ltd.); and organosiloxane polymer KP341 (from Shin-Etsu Chemical Co., Ltd.). These surfactants are used alone or in combination of two or more.

When the resist underlayer film-forming composition for lithography of the present invention contains the above-described surfactant, the proportion of the surfactant is 0.1 to 5 parts by mass, for example, and preferably 0.2 to 3 parts by mass, relative to 100 parts by mass of the above-described polymer contained in the composition.

EXAMPLES

The weight average molecular weights shown in Synthesis Examples 1 and 2 below in the present specification were measured by gel permeation chromatography (hereinafter abbreviated as GPC in the present specification). The measurements were performed using a GPC apparatus from Tosoh Corporation, under the measurement conditions shown below. The degree of distribution shown in each of the synthesis examples below in the present specification was calculated from the measured weight average molecular weight and the number average molecular weight. GPC column: Shodex [registered trademark]·Asahipak [registered trademark] (Showa Denko K.K.)
Column temperature: 40° C.
Solvent: N,N-dimethylformamide (DMF)
Flow rate: 0.6 mL/min Standard sample: polystyrene (from Tosoh Corporation)
Detector: RI detector (RI-8020 from Tosoh Corporation)

Synthesis Example 1

To 733.01 g of propylene glycol monomethyl ether, 100 g of terephthalic acid diglycidyl ester (trade name: DENACOL [registered trademark] EX711 from Nagase Chemtex Corporation), 63.32 g of 5-hydroxyisophthalic acid (from Tokyo Chemical Industry Co., Ltd.), 15.97 g of 4-tert-butylphthalic anhydride (from Tokyo Chemical Industry Co., Ltd.), and 3.96 g of benzyltriethylammonium chloride (from Tokyo Chemical Industry Co., Ltd.) were added and dissolved. After the reaction vessel was purged with nitrogen, the mixture was reacted at 135° C. for 4 hours to obtain a polymer solution. The polymer solution had good solubility in propylene glycol monomethyl ether, without becoming cloudy, for example, upon cooling to room temperature. As a result of GPC analysis, the polymer in the obtained solution had a weight average molecular weight of 4266 relative to standard polystyrene, and a degree of distribution of 2.39. The polymer obtained in this synthesis example has a structural unit of Formula (5a) and a structural unit of Formula (5b), and also has a structure of Formula (5c) at an end thereof:

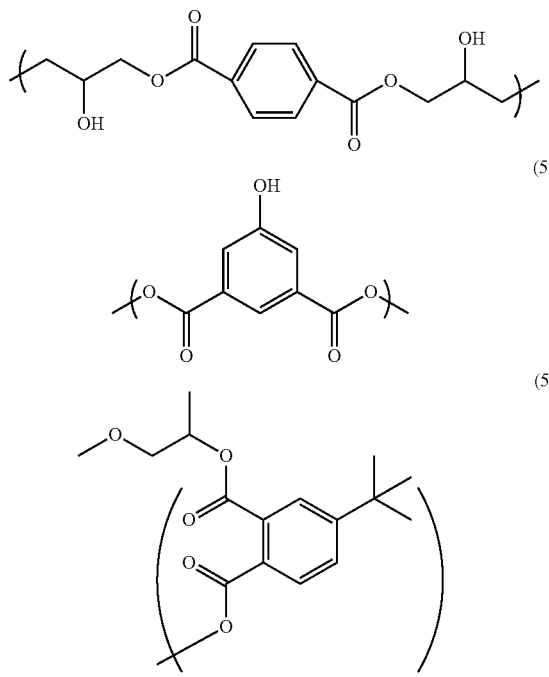

Synthesis Example 2

To 35.60 g of propylene glycol monomethyl ether, 5.00 g of terephthalic acid diglycidyl ester (trade name: DENACOL [registered trademark] EX711 from Nagase Chemtex Corporation), 3.15 g of 5-hydroxyisophthalic acid (from Tokyo Chemical Industry Co., Ltd.), and 0.20 g of benzyltriethylammonium chloride (from Tokyo Chemical Industry Co., Ltd.) were added and dissolved. After the reaction vessel was purged with nitrogen, the mixture was reacted at 135° C. for 4 hours to obtain a polymer solution. The polymer solution had good solubility in propylene glycol monomethyl ether, without becoming cloudy, for example, upon cooling to room temperature. As a result of GPC analysis, the polymer in the obtained solution had a weight average molecular weight of 15673 relative to standard polystyrene, and a degree of distribution of 3.39. The polymer obtained in this synthesis example has the structural unit of Formula (5a) and the structural unit of Formula (5b); however, the polymer does not have the structure of Formula (5c) at an end thereof:

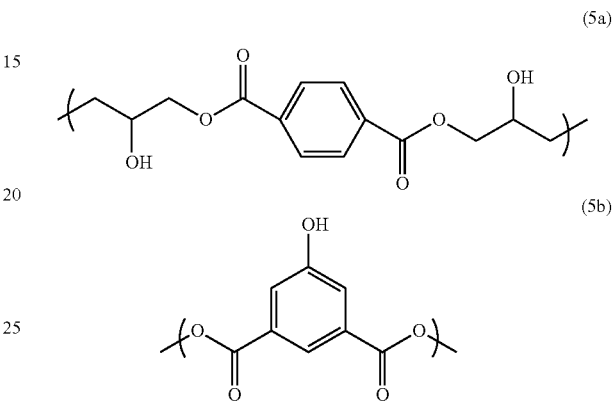

Example 1

Into 1.20 g of the polymer solution containing 0.22 g of the polymer, obtained in Synthesis Example 1 above, 0.055 g of tetramethoxymethylglycoluril (trade name: POWDERLINK [registered trademark] 1174 from Nihon Cytec Industries Inc.), 0.0055 g of pyridinium p-toluenesulfonate (from Tokyo Chemical Industry Co., Ltd.), and 0.022 g of N-(tert-butoxycarbonyl)glycine (from Tokyo Chemical Industry Co., Ltd.) were mixed, and then 7.90 g of propylene glycol monomethyl ether and 20.79 g of propylene glycol monomethyl ether acetate were added and dissolved. The solution was subsequently filtered through a polyethylene microfilter with a pore size of 0.05 μm, thus obtaining a resist underlayer film-forming composition for lithography.

Example 2

Into 1.20 g of the polymer solution containing 0.22 g of the polymer, obtained in Synthesis Example 1 above, 0.055 g of tetramethoxymethylglycoluril (trade name: POWDERLINK [registered trademark] 1174 from Nihon Cytec Industries Inc.), 0.0055 g of pyridinium p-toluenesulfonate (from Tokyo Chemical Industry Co., Ltd.), and 0.022 g of N-(tert-butoxycarbonyl)-L-alanine (from Tokyo Chemical Industry Co., Ltd.) were mixed, and then 7.90 g of propylene glycol monomethyl ether and 20.79 g of propylene glycol monomethyl ether acetate were added and dissolved. The solution was subsequently filtered through a polyethylene microfilter with a pore size of 0.05 μm, thus obtaining a resist underlayer film-forming composition for lithography.

Example 3

Into 1.20 g of the polymer solution containing 0.22 g of the polymer, obtained in Synthesis Example 1 above, 0.055 g of tetramethoxymethylglycoluril (trade name: POWDER- LINK [registered trademark] 1174 from Nihon Cytec Industries Inc.), 0.0055 g of pyridinium p-toluenesulfonate (from Tokyo Chemical Industry Co., Ltd.), and 0.022 g of N-(tert-butoxycarbonyl)-L-leucine monohydrate (from Tokyo Chemical Industry Co., Ltd.) were mixed, and then 7.90 g of propylene glycol monomethyl ether and 20.79 g of propylene glycol monomethyl ether acetate were added and dissolved. The solution was subsequently filtered through a polyethylene microfilter with a pore size of 0.05 μm, thus obtaining a resist underlayer film-forming composition for lithography.

Example 4

Into 1.20 g of the polymer solution containing 0.22 g of the polymer, obtained in Synthesis Example 1 above, 0.055 g of tetramethoxymethylglycoluril (trade name: POWDERLINK [registered trademark] 1174 from Nihon Cytec Industries Inc.), 0.0055 g of pyridinium p-toluenesulfonate (from Tokyo Chemical Industry Co., Ltd.), and 0.022 g of 1-(tert-butoxycarbonylamino)cyclopentanecarboxylic acid (from Tokyo Chemical Industry Co., Ltd.) were mixed, and then 7.90 g of propylene glycol monomethyl ether and 20.79 g of propylene glycol monomethyl ether acetate were added and dissolved. The solution was subsequently filtered through a polyethylene microfilter with a pore size of 0.05 μm, thus obtaining a resist underlayer film-forming composition for lithography.

Example 5

Into 3.19 g of a polymer solution containing 0.58 g of a polymer having a structural unit of Formula (6a) and a structural unit of Formula (6b) shown below, obtained in Synthesis Example 1 described in Patent Document 1 above, 0.14 g of tetramethoxymethylglycoluril (trade name: POWDERLINK [registered trademark] 1174 from Nihon Cytec Industries Inc.), 0.014 g of p-phenolsulfonic acid (from Tokyo Chemical Industry Co., Ltd.), 0.0029 g of a surfactant (trade name: MEGAFACE [registered trademark] R-40 from DIC Corporation), and 0.058 g of N-(tert-butoxycarbonyl)-L-leucine monohydrate (from Tokyo Chemical Industry Co., Ltd.) were mixed, and then 52.83 g of propylene glycol monomethyl ether and 23.76 g of propylene glycol monomethyl ether acetate were added and dissolved. The solution was subsequently filtered through a polyethylene microfilter with a pore size of 0.05 μm, thus obtaining a resist underlayer film-forming composition for lithography.

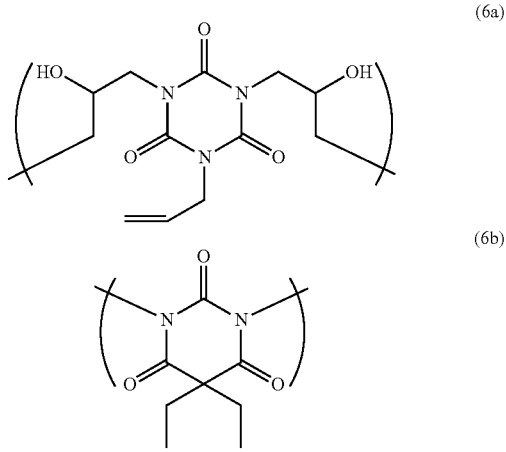

Comparative Example 1

Into 1.75 g of the polymer solution containing 0.31 g of the polymer, obtained in Synthesis Example 1 above, 0.078 g of tetramethoxymethylglycoluril (trade name: POWDERLINK [registered trademark] 1174 from Nihon Cytec Industries Inc.) and 0.0059 g of pyridinium p-toluenesulfonate (from Tokyo Chemical Industry Co., Ltd.) were mixed, and then 10.36 g of propylene glycol monomethyl ether and 27.72 g of propylene glycol monomethyl ether acetate were added and dissolved. The solution was subsequently filtered through a polyethylene microfilter with a pore size of 0.05 μm, thus obtaining a resist underlayer film-forming composition for lithography.

Comparative Example 2

Into 1.31 g of the polymer solution containing 0.23 g of the polymer, obtained in Synthesis Example 2 above, 0.059 g of tetramethoxymethylglycoluril (trade name: POWDERLINK [registered trademark] 1174 from Nihon Cytec Industries Inc.) and 0.0058 g of 5-sulfosalicylic acid were mixed, and then 21.27 g of propylene glycol monomethyl ether and 8.91 g of propylene glycol monomethyl ether acetate were added and dissolved. The solution was subsequently filtered through a polyethylene microfilter with a pore size of 0.05 j n, thus obtaining a resist underlayer film-forming composition for lithography.

Comparative Example 3

Into 5.16 g of the polymer solution containing 0.94 g of the polymer having the structural unit of Formula (6a) and the structural unit of Formula (6b), obtained in Synthesis Example 1 described in Patent Document 1 above, 0.23 g of tetramethoxymethylglycoluril (trade name: POWDERLINK [registered trademark] 1174 from Nihon Cytec Industries Inc.), 0.023 g of p-phenolsulfonic acid (from Tokyo Chemical Industry Co., Ltd.), and 0.0046 g of a surfactant (trade name: MEGAFACE [registered trademark] R-40 from DIC Corporation) were mixed, and then 50.93 g of propylene glycol monomethyl ether and 23.64 g of propylene glycol monomethyl ether acetate were added and dissolved. The solution was subsequently filtered through a polyethylene microfilter with a pore size of 0.05 μm, thus obtaining a resist underlayer film-forming composition for lithography.

[Boc Amino Acid Solubility Test]

Each of N-(tert-butoxycarbonyl)glycine, N-(tert-butoxycarbonyl)-L-alanine, N-(tert-butoxycarbonyl)-L-leucine monohydrate, and 1-(tert-butoxycarbonylamino)cyclopentanecarboxylic acid was dissolved in propylene glycol monomethyl ether and propylene glycol monomethyl ether acetate at a concentration of 2% by mass, and the solubility was confirmed. The results are shown in Table 1. In Table 1, "◯" indicates dissolved, and "x" indicates not dissolved.

TABLE 1

| | Solubility | |
|---|---|---|
| Boc Amino Acid | Propylene Glycol Monomethyl Ether | Propylene Glycol Monomethyl Ether Acetate |
| N-(tert-Butoxycarbonyl)glycine | ◯ | ◯ |
| N-(tert-Butoxycarbonyl)-L-alanine | ◯ | ◯ |

TABLE 1-continued

| Boc Amino Acid | Solubility | |
|---|---|---|
| | Propylene Glycol Monomethyl Ether | Propylene Glycol Monomethyl Ether Acetate |
| N-(tert-Butoxycarbonyl)-L-leucine Monohydrate | ○ | ○ |
| 1-(tert-Butoxycarbonylamino)-cyclopentanecarboxylic Acid | ○ | ○ |

[Test of Elution into Photoresist Solvents]

Each of the resist underlayer film-forming compositions of Examples 1 to 5 and Comparative Examples 1 to 3 was applied to a silicon wafer as a semiconductor substrate, using a spinner. The silicon wafer was placed on a hot plate and baked at 205° C. for 1 minute, thus forming a resist underlayer film (film thickness: 5 nm). These resist underlayer films were immersed in ethyl lactate and propylene glycol monomethyl ether as solvents for use in photoresists, and were confirmed to be insoluble in these solvents.

[Test of Coating Properties as Thin Films]

Each of the resist underlayer film-forming compositions of Examples 1 to 5 and Comparative Example 2 was applied at film thickness of 5 nm to silicon wafers each having a square pattern with a length of 13 μm, a width of 13 μm, and a height of 230 nm formed thereon, or having a cross pattern with a length of 14 μm, a width of 14 μm, and a height of 230 nm formed thereon, of which upper surfaces and cross sections are shown in FIG. 1, and the coating properties were confirmed with an optical microscope (MX61L from Olympus Corporation) under a dark field. Only in the cases where the resist underlayer film-forming compositions of Examples 1 to 5 were applied, no coating unevenness was observed, and good coating properties were confirmed.

[EUV Exposure Test 1]

Each of the resist underlayer film-forming compositions of Examples 1 to 4 and Comparative Example 1 was spin-coated over a silicon wafer, and heated at 205° C. for 1 minute, thus forming a resist underlayer film. A resist solution for EUV intended for positive resist process (resist A or B) was spin-coated over the resist underlayer film and heated, thus forming an EUV resist layer. Subsequently, by using the SEMATECH Albany Exitech micro-exposure EUV tool (eMET) at NA (numerical aperture)=0.3, the above-described EUV resist layer was exposed. After the exposure, the EUV resist layer was subjected to PEB (post-exposure bake), cooled to room temperature on a cooling plate, and subjected to development and rinsing treatment, thus forming a resist pattern on the above-described silicon wafer. The lithography performance was evaluated through top-down measurement using a CD-scanning electron microscope (CD-SEM). The evaluation was conducted by determining whether or not a 24-nm line and space (L/S) was formed, and comparing sizes of the line width roughness (LWR) of the line pattern through observation from the top surface of the line pattern formed. The evaluation results are shown in Tables 2 and 3. The case where the line and space was formed is denoted as "Good". With regard to LWR, the size of variations in the line width of the line pattern formed is expressed in nm. Because the value of LWR is preferably smaller, the resist underlayer film-forming compositions of Examples 1 to 4 showed LWR better than that of the resist underlayer film-forming composition of Comparative Example 1.

TABLE 2

| Resist A | LWR | Whether or Not L/S was Formed |
|---|---|---|
| Example 1 | 4.4 nm | Good |
| Example 2 | 4.6 nm | Good |
| Example 3 | 3.9 nm | Good |
| Comparative Example 1 | 4.8 nm | Good |

TABLE 3

| Resist B | LWR | Whether or Not L/S was Formed |
|---|---|---|
| Example 3 | 4.4 nm | Good |
| Example 4 | 4.2 nm | Good |
| Comparative Example 1 | 4.9 nm | Good |

[EUV Exposure Test 2]

Each of the resist underlayer film-forming compositions of Example 5 and Comparative Example 3 was spin-coated over a silicon wafer, and heated at 205° C. for 1 minute, thus forming a resist underlayer film. A resist solution for EUV intended for negative resist process (resist C) was spin-coated over the resist underlayer film and heated, thus forming an EUV resist layer. Subsequently, by using an EUV exposure apparatus (NXE3100 from ASML Co., Ltd.), the above-described EUV resist layer was exposed at NA=0.25 Dipole. After the exposure, the EUV resist layer was subjected to PEB (post-exposure bake), cooled to room temperature on a cooling plate, and subjected to development and rinsing treatment, thus forming a resist pattern on the above-described silicon wafer. The lithography performance was evaluated through top-down measurement using a CD-scanning electron microscope (CD-SEM). The evaluation was conducted by determining whether or not a 25-nm line and space (L/S) was formed, and comparing sizes of the line width roughness (LWR) of the line pattern through observation from the top surface of the line pattern formed. The evaluation results are shown in Table 4. The case where the line and space was formed is denoted as "Good". With regard to LWR, the size of variations in the line width of the line pattern formed is expressed in nm. Because the value of LWR is preferably smaller, the resist underlayer film-forming composition of Example 5 showed LWR better than that of the resist underlayer film-forming composition of Comparative Example 3.

TABLE 4

| Resist C | LWR | Whether or Not L/S was Formed |
|---|---|---|
| Example 5 | 4.1 nm | Good |
| Comparative Example 3 | 4.2 nm | Good |

The invention claimed is:

1. A resist underlayer film-forming composition for lithography comprising a polymer, 0.1 to 30 parts by mass of a compound having an amino group protected with a Boc group and an unprotected carboxyl group, or a hydrate of the compound, relative to 100 parts by mass of the polymer, and a solvent, wherein the compound is a compound of Formula (1a) or (1b):

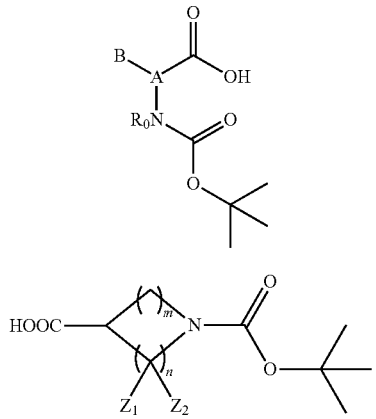

wherein A is a $C_{1-6}$ linear hydrocarbon group, alicyclic hydrocarbon group, aromatic hydrocarbon group, or aromatic heterocyclic group, and the linear hydrocarbon group optionally has at least one hetero atom; B is a hydrogen atom or a $C_{1-21}$ organic group, and the organic group optionally has at least one linking group selected from the group consisting of a carbonyl group, an —OC(=O)— group, an —O— group, a —S— group, a sulfonyl group, and a —NH— group, and/or optionally has at least one substituent selected from the group consisting of a hydroxy group, a thiol group, a halogeno group, an amino group, and a nitro group; $R_0$ is a hydrogen atom or a methyl group; $Z_1$ and $Z_2$ are each independently a hydrogen atom, a hydroxy group, a halogeno group, an amino group, or a nitro group; m is 0 to 2; and n is an integer from 1 to 4.

2. The resist underlayer film-forming composition for lithography according to claim 1, wherein the polymer has a structure of Formula (4) at an end of a polymer chain thereof:

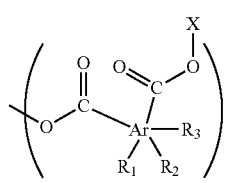

wherein $R_1$, $R_2$, and $R_3$ are each independently a hydrogen atom, a $C_{1-13}$ linear or branched alkyl group, a halogeno group, or a hydroxy group, and at least one of $R_1$, $R_2$, and $R_3$ is the alkyl group; Ar is a benzene ring, a naphthalene ring, or an anthracene ring, and each of the two carbonyl groups is attached to one of the adjacent two carbon atoms of the ring represented by Ar; and X is a $C_{1-6}$ linear or branched alkyl group optionally having a $C_{1-3}$ alkoxy group as a substituent.

3. The resist underlayer film-forming composition for lithography according to claim 1, which further comprises 1 to 100 parts by mass of a crosslinking agent relative to 100 parts by mass of the polymer, and 0.1 to 25 parts by mass of a crosslinking catalyst relative to 100 parts by mass of the crosslinking agent.

4. A resist underlayer film-forming composition for lithography comprising a polymer, 0.1 to 30 parts by mass of a compound having an amino group protected with a Boc group and an unprotected carboxyl group, or a hydrate of the compound, relative to 100 parts by mass of the polymer, and a solvent,
wherein the polymer has a structural unit of Formula (2) and a structural unit of Formula (3):

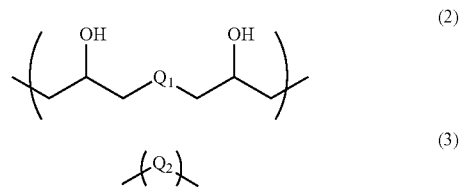

wherein $Q_1$ and $Q_2$ are each independently a divalent organic group having a $C_{1-13}$ hydrocarbon group optionally having a substituent, a divalent organic group having an aromatic ring, or a divalent organic group having a heterocyclic ring containing 1 to 3 nitrogen atoms.

5. The resist underlayer film-forming composition for lithography according to claim 4, wherein the structural unit of Formula (2) is represented by Formula (2'):

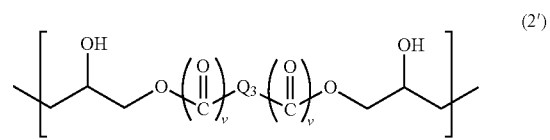

wherein $Q_3$ is a $C_{1-13}$ hydrocarbon group optionally having a substituent, or an aromatic ring optionally having a substituent, and two v's are each independently 0 or 1.

6. The resist underlayer film-forming composition for lithography according to claim 4, wherein the structural unit of Formula (3) is represented by Formula (3'):

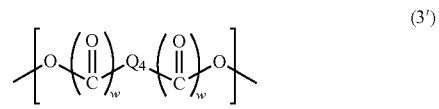

wherein $Q_4$ is a $C_{1-13}$ hydrocarbon group optionally having a substituent, or an aromatic ring optionally having a substituent, and two w's are each independently 0 or 1.

7. The resist underlayer film-forming composition for lithography according to claim 4, wherein the polymer has a structure of Formula (4) at an end of a polymer chain thereof:

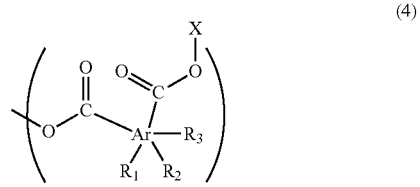

wherein $R_1$, $R_2$, and $R_3$ are each independently a hydrogen atom, a $C_{1-13}$ linear or branched alkyl group, a halogeno group, or a hydroxy group, and at least one of $R_1$, $R_2$, and $R_3$ is the alkyl group; Ar is a benzene ring, a naphthalene ring, or an anthracene ring, and each of the two carbonyl groups is attached to one of the adjacent two carbon atoms of the ring represented by Ar; and X is a $C_{1-6}$ linear or branched alkyl group optionally having a $C_{1-3}$ alkoxy group as a substituent.

8. The resist underlayer film-forming composition for lithography according to claim 4, which further comprises 1 to 100 parts by mass of a crosslinking agent relative to 100 parts by mass of the polymer, and 0.1 to 25 parts by mass of a crosslinking catalyst relative to 100 parts by mass of the crosslinking agent.

* * * * *